(12) United States Patent
Mattiza et al.

(10) Patent No.: US 7,245,351 B2
(45) Date of Patent: Jul. 17, 2007

(54) ALIGNMENT MARK FOR COARSE ALIGNMENT AND FINE ALIGNMENT OF A SEMICONDUCTOR WAFER IN AN EXPOSURE TOOL

(75) Inventors: Diana Mattiza, Dresden (DE); Heiko Hommen, Dresden (DE); Holger Hasse, Dresden (DE)

(73) Assignee: Infineon Technologies, AG, Neubiberg (DE)

( * ) Notice: Subject to any disclaimer, the term of this patent is extended or adjusted under 35 U.S.C. 154(b) by 277 days.

(21) Appl. No.: 10/951,596

(22) Filed: Sep. 29, 2004

(65) Prior Publication Data

US 2005/0068508 A1 Mar. 31, 2005

(30) Foreign Application Priority Data

Sep. 30, 2003 (DE) ................. 103 45 471

(51) Int. Cl.
*G03B 27/52* (2006.01)
*G03B 27/42* (2006.01)
*G03F 9/00* (2006.01)

(52) U.S. Cl. ................ 355/55; 355/53; 430/5
(58) Field of Classification Search .......... 355/53, 355/55, 67–71; 356/399–401; 250/548; 430/5, 20, 30
See application file for complete search history.

(56) References Cited

U.S. PATENT DOCUMENTS 5,966,201 A * 10/1999 Shiraishi et al. ............. 355/53
6,118,517 A * 9/2000 Sasaki et al. ................. 355/53
6,778,275 B2 * 8/2004 Bowes ....................... 356/400
2002/0039828 A1 4/2002 Hahmann et al.
2003/0053058 A1 3/2003 Tanaka
2003/0054574 A1 3/2003 Tanaka et al.

FOREIGN PATENT DOCUMENTS

JP 09-162102 6/1997

* cited by examiner

*Primary Examiner*—Henry Hung Nguyen
(74) *Attorney, Agent, or Firm*—Edell, Shapiro & Finnan, LLC

(57) ABSTRACT

An alignment mark for the coarse alignment and fine alignment of a semiconductor wafer in an exposure tool includes a first partial structure for generating a first reflection pattern in the exposure tool for the fine alignment of the semiconductor wafer, and a second partial structure for generating a second reflection pattern in the exposure tool for the coarse alignment of the semiconductor wafer. The first partial structure has a plurality of first structure elements, which are arranged relatively parallel and in a manner lying next to one another with a predetermined distance between midpoints symmetrically around the center of an inner region. The second partial structure has a plurality of second structure elements, formed in a manner corresponding to a pattern stored in the exposure tool and being arranged in the inner region.

12 Claims, 5 Drawing Sheets

80 μm

60 μm

60 μm

60 μm

ALIGNMENT MARK FOR COARSE ALIGNMENT AND FINE ALIGNMENT OF A SEMICONDUCTOR WAFER IN AN EXPOSURE TOOL

CROSS REFERENCE TO RELATED APPLICATIONS

This application claims priority under 35 USC §119 to German Application No. DE 103 45 471.3, filed on Sep. 30, 2003, and titled "Alignment Mark For Coarse Alignment And Fine Alignment Of A Semiconductor Wafer In An Exposure Tool," the entire contents of which are hereby incorporated by reference.

FIELD OF THE INVENTION

The present invention relates to an alignment mark for the orientation of a semiconductor wafer in an exposure tool, and to the use of the alignment mark before carrying out a projection step in an exposure tool.

BACKGROUND

For fabrication of integrated circuits, layers provided with different electrical properties are usually applied on semiconductor wafers and each patterned lithographically. A lithographic patterning step may include applying a photosensitive resist, exposing the photosensitive resist with a desired structure for the relevant layer and developing it, and then transferring the resist mask thus produced into the underlying layer in an etching step.

The exposure of the photosensitive resist is carried out, for example, in a wafer stepper or wafer scanner in a lithographic projection step. Before the beginning of the respective exposures, alignment or orientation sequences, which use alignment marks are provided. The alignment marks are typically arranged in the edge regions of a mask that provides the relevant structure.

During exposure, the alignment marks are transferred into a sawing kerf that separates the individual exposure fields on the semiconductor wafer. The alignment marks enable the positional determination of the structures formed on the semiconductor wafer or, by determining the position of the alignment marks, it is possible to deduce the precise positioning and orientation of the structure for the integrated circuit.

The orientation or alignment of the semiconductor wafer in the exposure tool with respect to the projection optical arrangement is carried out by comparing the alignment marks with reference marks. Such reference marks are often inserted via the lens system of the projection optical arrangement relative to a detector.

The way in which the alignment method is carried out on an individual basis depends to the device manufacturers. An offset of the actual position of the alignment marks relative to the ideal position of the reference mark is established based on the mark comparison. The semiconductor wafer, generally deposited on a substrate holder, can consequently be corrected in terms of its position, so that the subsequent exposure can be performed with high positional accuracy.

Various alignment marks are known in the art, each designed for specific purposes. FIG. 6 shows an alignment mark for the coarse alignment of the semiconductor wafer. The alignment mark is formed as a cross. Two alignment marks for coarse alignment are usually arranged in the region of the sawing kerf. The alignment mark according to FIG. 6 approximately occupies an area having a width of 100 μm and a length of 100 μm.

The coordinates of the alignment marks for coarse alignment in the sawing kerf are normally stored in the exposure tool. For coarse alignment, the substrate holder is moved to the stored positions. The orientation of the semiconductor wafer during coarse alignment is usually carried out based on a detection of scattered light from a light source, which arises through reflection at the alignment marks. The scattered light may, for example, be recorded by an optical microscope and be imaged onto a CCD camera. During the orientation of the semiconductor wafer, the image of the CCD camera is analyzed, and structures corresponding to the alignment marks for coarse alignment are sought by a pattern recognition method.

A further type of alignment mark is used for fine alignment. In the case of most manufacturers of exposure tools, the alignment marks are embodied as arrangements of elongate, parallel bars that usually have a structure width of a few micrometers. One example of an alignment mark for fine alignment is shown in FIG. 7. The alignment mark according to FIG. 7 approximately occupies an area having a width of 120 μm and a length of 50 μm. Two of the alignment marks arranged perpendicular to one another are necessary for fine alignment in the horizontal direction and in the vertical direction.

The alignment marks shown in FIGS. 6 and 7 correspond to the design rules of a manufacturer of exposure tools, in this case, from the company Canon.

The alignment marks for fine alignment are usually arranged at a predetermined distance from the alignment marks for coarse alignment, which, as a result, also serve for finding the alignment marks for fine alignment. The substrate holder is displaced to the known position of the alignment mark for fine alignment. During fine alignment, the orientation of the semiconductor wafer is likewise carried out on the basis of a detection of scattered light from a light source, which arises through reflection at the alignment marks. In contrast to the case discussed above, pattern recognition is not normally carried out, rather the intensity profile of the scattered light is measured, from which it is possible to deduce the position of the alignment mark for fine alignment.

Because alignment marks for coarse alignment and the alignment marks for fine alignment are fit at different positions in the sawing kerf region of the exposure field of the integrated circuit the time requirement expended for the movement of the substrate holder is increased, and accordingly, the production throughput in the fabrication of integrated circuits is reduced. Further, the alignment marks for coarse alignment and for fine alignment occupy a large area in the region of the sawing kerf.

SUMMARY

An alignment mark for the coarse alignment and fine alignment of a semiconductor wafer in an exposure tool can include a first partial structure for generating a first reflection pattern in the exposure tool for the fine alignment of the semiconductor wafer and a second partial structure for generating a second reflection pattern in the exposure tool for the coarse alignment of the semiconductor wafer. The first partial structure has a plurality of first structure elements arranged in a plurality of groups. Within each group, the first structure elements are arranged relatively essentially parallel and in a manner lying next to one another with a predetermined distance between midpoints. The plurality of the groups are arranged relatively symmetrically around the center of an inner region. The second partial structure has a plurality of second structure elements. The second structure elements of the second partial structure are formed in a manner corresponding to a pattern stored in the exposure tool and are arranged in the inner region.

The alignment mark according to the invention has partial structures that can be used for the coarse and for the fine alignment of a semiconductor wafer in an exposure tool. The combination of these properties means that on a semiconductor wafer provided with the alignment mark according to the invention, a relatively small area is required on the substrate of the semiconductor wafer.

In one embodiment of the alignment mark, the first partial structure includes four groups. Within each group, the first structure elements of the first partial structure are formed in lines spaced apart equidistantly. The four groups are arranged relatively mirror-symmetrically around the center of the inner region in the horizontal and vertical direction. This embodiment permits a fine alignment of a semiconductor wafer both in the horizontal direction and in the vertical direction. The alignment mark according to the invention requires a relatively small area on the substrate of the semiconductor wafer.

In another embodiment of the alignment mark, the first partial structure has a total of eight lines. This embodiment permits the use of the alignment mark for fine alignment in an exposure tool from the company Canon.

In a further embodiment of the alignment mark, the second structure elements of the second partial structure are formed in two lines. The two lines together form a structure of a cross whose midpoint lies in the center of the inner region. This embodiment permits the use of the alignment mark for coarse alignment in an exposure tool from the company Canon.

If different embodiments of the alignment mark according to the invention are used for the orientation of a semiconductor wafer based on detection from a scattered light from a light source which arises through reflection at the first structure elements and the second structure elements, the light reflected from the first structure elements may be used for fine alignment and the light reflected from the second structure elements may be used for coarse alignment.

BRIEF DESCRIPTION OF THE FIGURES

The invention will now be explained in more detail with reference to the accompanying drawing, in which.

DETAILED DESCRIPTION

Figure 1A:
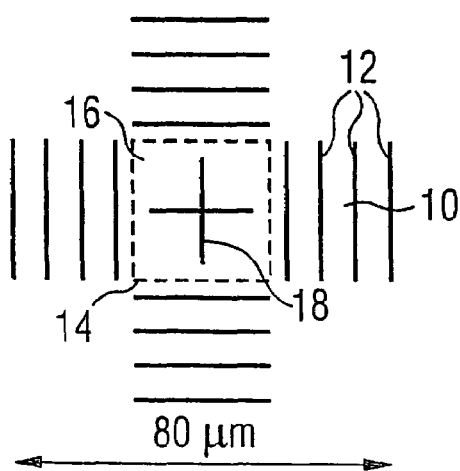
FIGS. 1A to 1E diagrammatically show in each case embodiments of an alignment mark according to the invention in a plan view, FIGS. 2A to 2F diagrammatically show in each case further embodiments of the alignment mark according to the invention in a plan view, FIGS. 3A to 3D diagrammatically show in each case further embodiments of the alignment mark according to the invention in a plan view, FIGS. 4A to 4D diagrammatically show in each case further embodiments of the alignment mark according to the invention in a plan view, FIG. 5 diagrammatically shows an embodiment of the second partial structure of the alignment mark according to the invention, FIG. 6 diagrammatically shows a plan view of an alignment mark for the coarse alignment of a semiconductor wafer according to the prior art, and FIG. 7 diagrammatically shows a plan view of an alignment mark for the fine alignment of a semiconductor wafer according to the prior art.

FIG. 1A shows a possible embodiment of the alignment mark according to the invention. The alignment mark includes a partial structure 10 having a plurality of first structure elements 12. The first structure elements 12 may be, for example, elevated layers on the top side of the semiconductor wafer. However, the first structure elements 12 are formed by recesses, for example, in the form of a trench. The trench may be, for example, a deep trench required for the fabrication of a trench capacitor in the production of random access memories (DRAM).

The first structure elements 12 may be, for example, lines approximately 0.8 µm wide. In the present case, FIG. 1A shows sixteen lines of this type respectively arranged in four groups of four. Within a group of four, the individual structure elements 12 are oriented relatively parallel to one another and have relatively the same start and end points along a direction relatively perpendicular to the structure elements 12. The distance between midpoints of the first structure elements 12 running relatively parallel is approximately 15 µm. The length of the structure elements 12 may be 25 µm, for example.

The first structure elements 12 are arranged relatively symmetrically around an inner region 14, so that no first structure elements 12 lie in the inner region 14, depicted as a dashed line in FIG. 1A.

In the case of the alignment mark according to FIG. 1A, the two groups of four of the first structure elements 12 are formed as lines along a vertical axis and two groups of four of the first structure elements 12 are formed as lines along a horizontal axis. The arrangement of the first structure elements 12 is embodied relatively mirror-symmetrically and relatively centro-symmetrically around the center of the inner region 14. The distance between that structure element 12 of a group of four, which lies nearest to the center and the center of the inner region 14 is approximately 15 µm in this exemplary embodiment.

In the case of the alignment mark according to FIG. 1A, a second partial structure is arranged in the inner region 14. The second partial structure 16 includes second structure elements 18, which are formed by lines having a width of approximately 4 µm in the present exemplary embodiment. The structure elements 18 of the second partial structure 16 are formed in two lines that are relatively perpendicular to one another and together form a structure of a cross. The midpoint of the cross lies in the center of the inner region 14. The cross formed by the structure elements 18 has four partial elements of approximately the same length, which are approximately 13 µm long in the present example.

The alignment mark according to FIG. 1A occupies an area having outer sides with a length of approximately 80 µm. The alignment mark may be arranged, for example, in the sawing kerf region of an exposure field on a semiconductor wafer. The relatively small space requirement of the alignment mark makes it possible to reduce the width of the sawing kerf, thereby saving area on the semiconductor wafer.

The alignment mark according to the invention, which is shown in FIG. 1A, may be used for orienting a semiconductor wafer in an exposure tool. The coordinates of the alignment mark in the sawing kerf are normally stored in the exposure tool. For coarse alignment, the substrate holder is moved to the stored position. The coarse alignment of the semiconductor wafer is carried out based on detection of scattered light from a light source, which arises through reflection at the second structure elements 18.

The scattered light may be recorded, for example, by an optical microscope and be imaged onto a CCD camera. During the orientation of the semiconductor wafer, this image of the CCD camera is then analyzed, and structures corresponding to the partial structure 16 are sought by a pattern recognition method. The alignment mark according to the invention enables the orientation of a semiconductor wafer, for example, in an exposure tool from the company Canon.

The orientation of the semiconductor wafer during fine alignment is likewise carried out based on a detection of scattered light from a light source, which arises through reflection at the first structure elements 12 of the first partial structure 10. In contrast to coarse alignment, pattern recognition is not normally carried out during fine alignment, rather the intensity profile of the scattered light is measured, from which it is possible to deduce the position of the alignment mark. For fine alignment, it is not necessary to move the semiconductor wafer on the substrate holder since the first partial structure 10 and the second partial structure 16 are arranged adjacent.

In the embodiment in accordance with FIG. 1A, the first partial structure 10 has second structure elements 12 arranged in the horizontal direction and in the vertical direction. A fine alignment can thus be carried out both in the horizontal direction and in the vertical direction based on the measurement of the intensity profile of the reflected light. The use of the alignment mark according to the invention makes it possible to achieve the coarse and fine alignment of the semiconductor wafer by a single movement of the substrate holder to the approximate position of the alignment mark. This increases the production throughput in contrast to the alignment marks according to the prior art as discussed in the introduction. One coordinate is stored, which reduces the occurrence of possible incorrect inputs.

FIGS. 1B to 1E show further embodiments of the alignment mark according to the invention, which differ slightly by virtue of the configuration of the first structure elements 12. These embodiments each have approximately the same dimensions and line widths of the first structure elements 12 as the alignment mark in accordance with FIG. 1A.

Figure 1B:
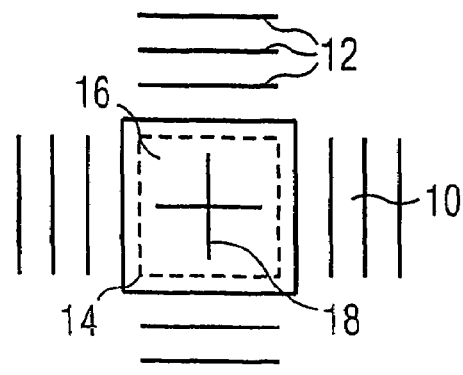

FIG. 1B shows an alignment mark in which the four inner lines of the first structure elements 12 are connected to form relatively square pattern that encloses the inner region 14.

Figure 1C:
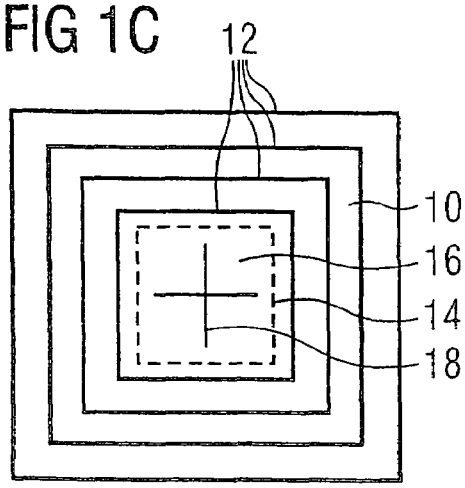

FIG. 1C shows an alignment mark in which the lines of the first structure elements 12 are connected to form relatively square pattern that enclose the inner region 14.

Figure 1D:
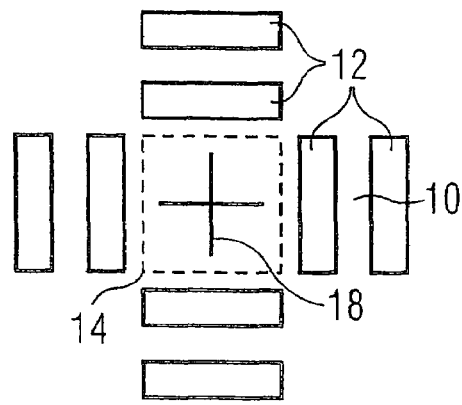

FIG. 1D shows an alignment mark in which two adjacent lines in each case are connected to form a rectangle.

Figure 1E:
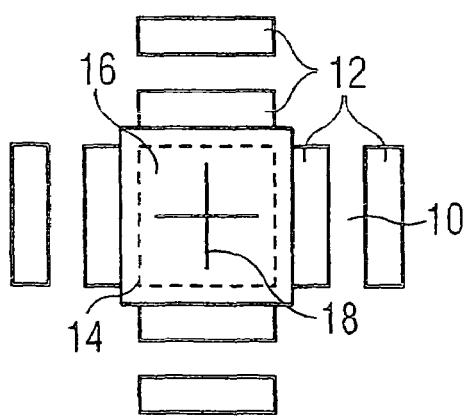

FIG. 1E shows an alignment mark in which the four inner lines of the first structure elements 12 are connected to form relatively square pattern. Furthermore, two adjacent lines in each case are connected to form a rectangle.

The alignment marks in accordance with FIGS. 1B to 1E may likewise be used, as already explained in the case of the embodiment according to FIG. 1A, in an exposure tool for coarse alignment based on a pattern recognition and for fine alignment based on a measurement of the intensity profile.

Figure 2A:
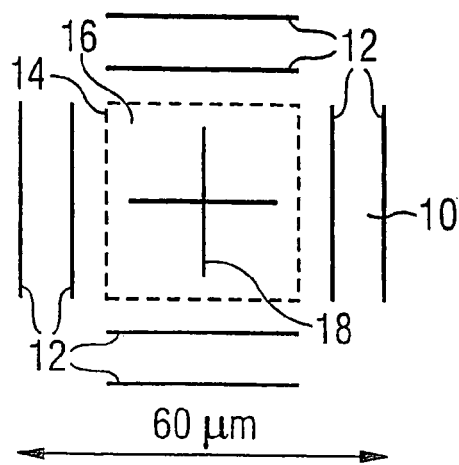

FIG. 2A shows a further embodiment of the alignment mark according to the invention. This differs from the embodiment in accordance with FIG. 1A in that fewer first structure elements 12 of the partial structure 10 are formed than in the case of the alignment mark according to FIG. 1A.

A total of eight first structure elements are arranged in the alignment mark according to FIG. 2A. The partial structure 16 having second structure elements 18 is in the region 14. The dimensions of the first structure elements 12 and of the second structure elements 18 are chosen as in the case of the alignment mark according to FIG. 1A.

The alignment mark in accordance with FIG. 2A occupies an area having outer sides with a length of approximately 60 µm. The alignment mark may be arranged for example, in the region of the sawing kerf of an exposure field on a semiconductor wafer.

The relatively small space requirement of the alignment mark makes it possible to further reduce the width of the sawing kerf, thereby saving area on the semiconductor wafer.

FIGS. 2B to 2F show further embodiments of the alignment mark according to the invention, which differ slightly by virtue of the configuration of the first structure elements 12. These embodiments each have approximately the same dimensions and line widths of the first structure elements 12 as the alignment mark in accordance with FIG. 2A.

Figure 2B:
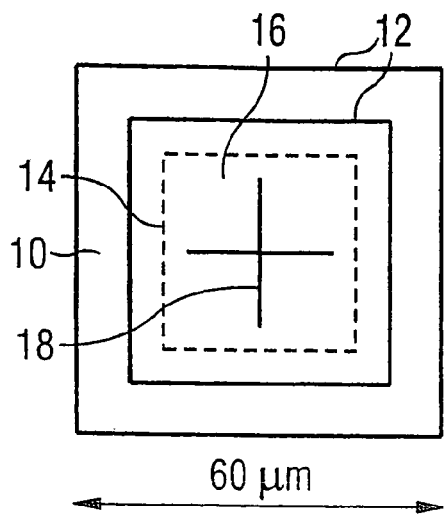

FIG. 2B shows an alignment mark in which the lines of the first structure elements 12 are connected to form relatively square pattern that enclose the inner region 14.

Figure 2C:
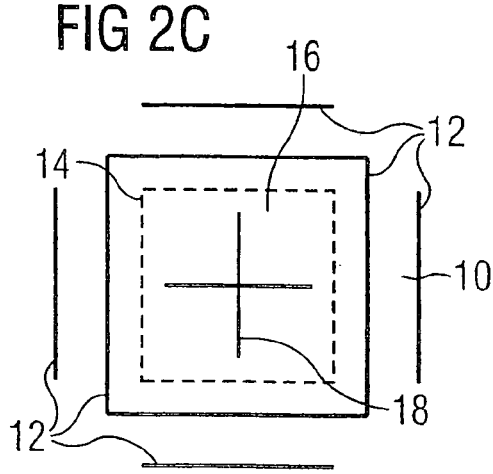

FIG. 2C shows an alignment mark in which the four inner lines of the first structure elements 12 of the alignment mark according to FIG. 2A are connected to form relatively square pattern that encloses the inner region 14.

Figure 2D:
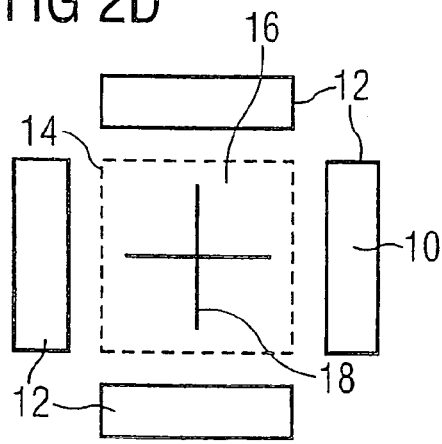

FIG. 2D shows an alignment mark in which two adjacent lines in each case are connected to form a rectangle.

Figure 2E:
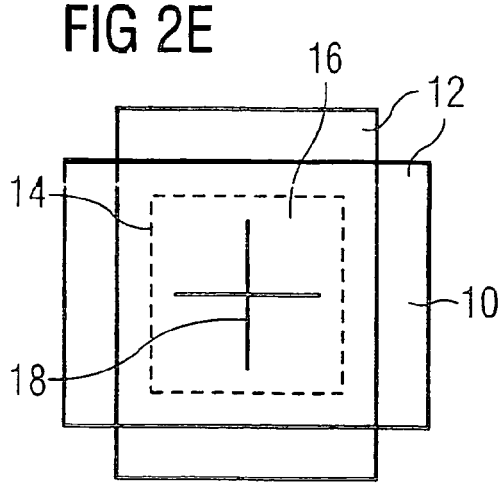

FIG. 2E shows an alignment mark in which two inner vertical lines of the alignment mark according to FIG. 2A are connected to two outer horizontal lines to form a rectangle.

Figure 2F:
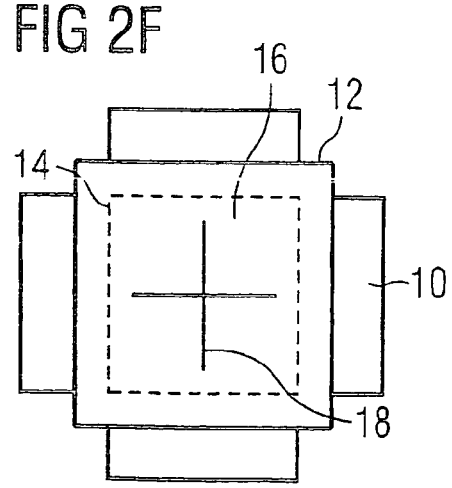
Figure 3A:
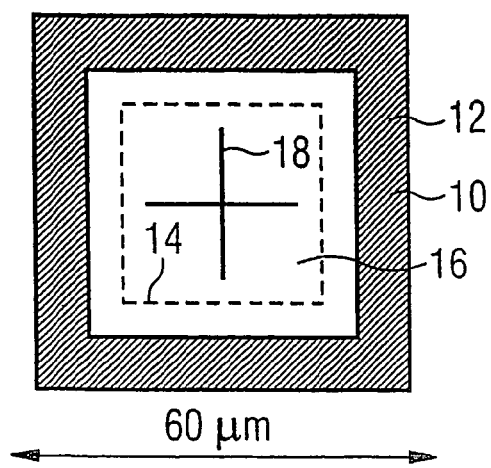
Figure 3B:
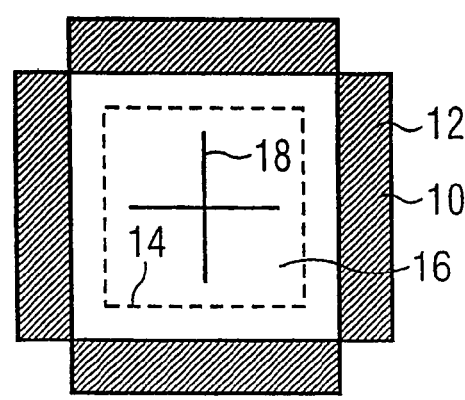
Figure 3C:
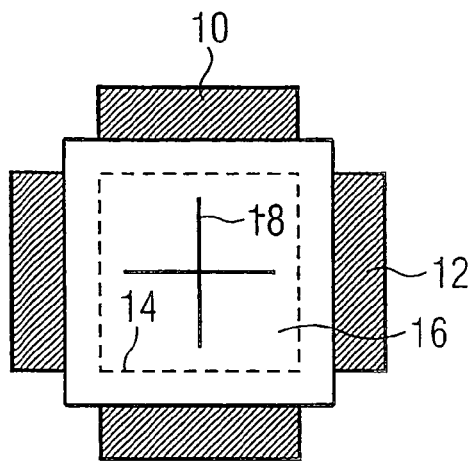
Figure 3D:
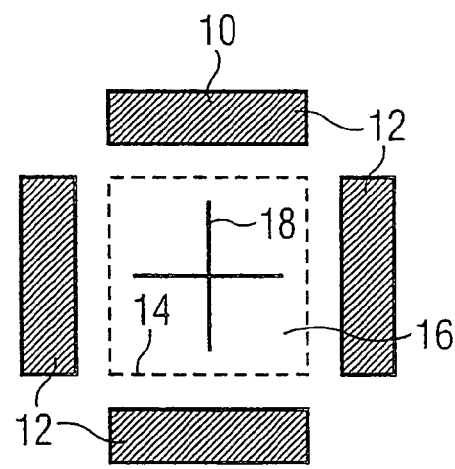
Figure 4A:
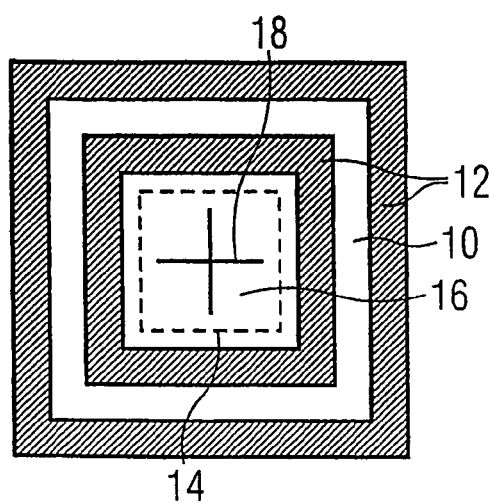
Figure 4B:
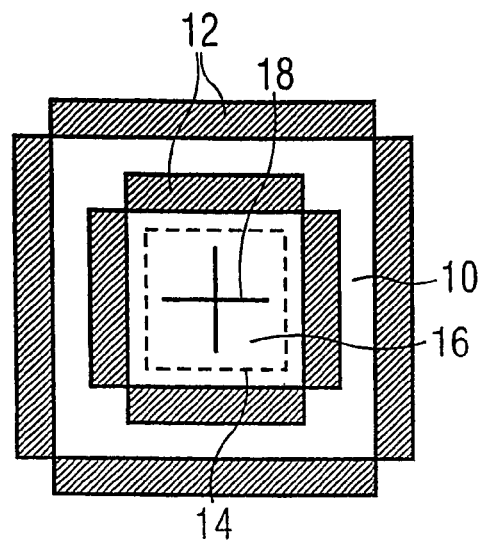
Figure 4C:
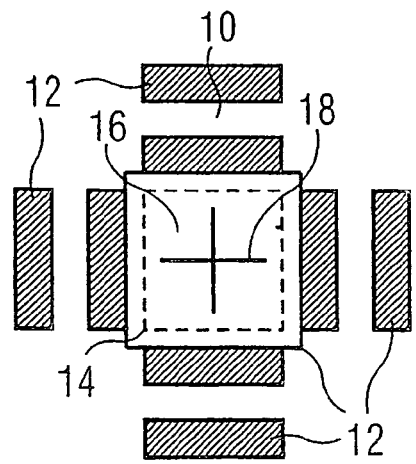
Figure 4D:
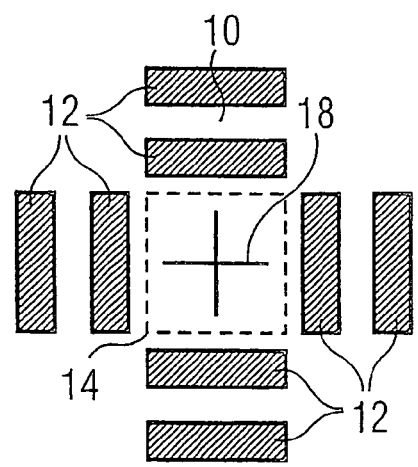

FIG. 2F shows an alignment mark in which the two inner lines of the first structure elements 12 are connected to form relatively square pattern. Furthermore, two adjacent lines are connected to form a rectangle.

The alignment marks according to FIGS. 2A to 2F may be used, as already explained in the case of the embodiment according to FIG. 1A, in an exposure tool for coarse alignment based on a pattern recognition and for fine alignment based on a measurement of the intensity profile.

A further embodiment of the invention is shown in FIGS. 3A to 3D. The embodiments differ from the alignment marks according to FIGS. 2A to 2F in that the first structure elements 12 are not embodied as lines, but rather as a structured pattern.

The structured pattern may be formed, for example, in the form of hatched lines or a chessboard-type pattern with substructures. The size of the substructure of the pattern may be in the region of a few µm or even smaller.

The structured pattern can correspond to a circuit pattern of the layer that is currently to be exposed on the semiconductor wafer. One example of a circuit pattern would be a structure with square or rectangular patterns that are required, for example, for the fabrication of deep trenches of a trench capacitor for a random access memory (DRAM). However, the circuit pattern of the first structure elements 12 may also be embodied in the form of a contact hole layer with relatively circular patterns or as a dense line/space pattern, for example, of a connection layer. In the fabrication of DRAM memory chips, for example, circuit patterns having line widths of 70, 90, or 110 nm, are used.

A further embodiment of the invention is shown in FIGS. 4A to 4D. The embodiments differ from the alignment marks according to FIGS. 1A to 1E in that the first structure elements 12 are not embodied as lines, but rather as a structured pattern.

The structured pattern may be formed, for example, in the form of hatched lines or a chessboard-type pattern with substructures. The size of the substructure of the pattern may be, for example, in the region of a few μm or even smaller.

The structured pattern can correspond to a circuit pattern of the layer to be exposed on the semiconductor wafer. One example of a circuit pattern would be a structure with square or rectangular patterns that are required, for example, for the fabrication of deep trenches of a trench capacitor for a random access memory (DRAM).

However, the circuit pattern of the first structure elements 12 may also be embodied in the form of a contact hole layer with relatively circular patterns or as a dense line/space pattern, for example, of a connection layer. In the fabrication of DRAM memory chips, for example, circuit patterns having line widths of 70, 90, or 110 nm, are used.

Figure 5:
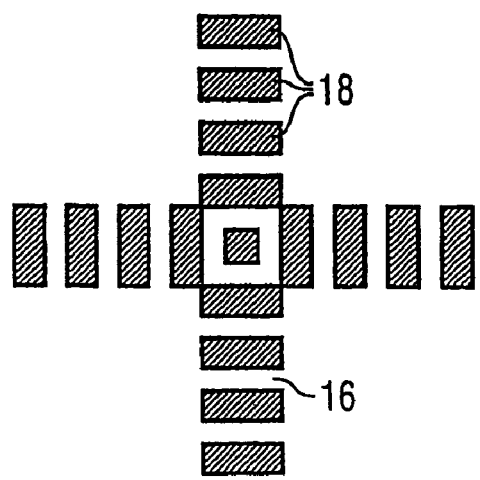
Figure 6:
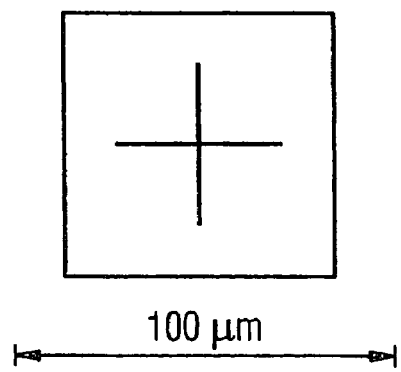
Figure 7:
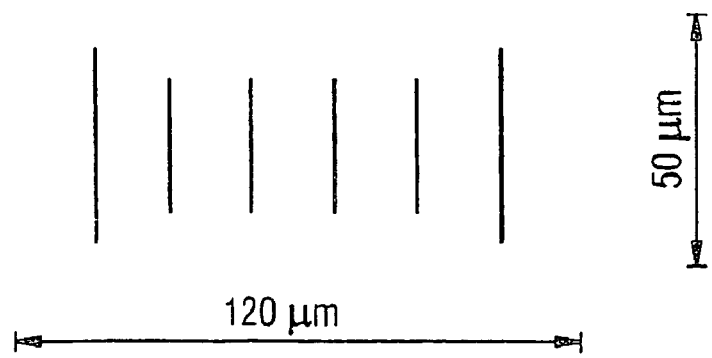

A further exemplary embodiment of the second structure elements 18 of the second partial structure 16 is shown in FIG. 5. This embodiment of the second structure elements 18 of the second partial structure 16 differs from the second structure elements 18 of the second partial structure 16 of the alignment marks according to FIGS. 1 to 4 in that the second structure elements 18 of the second partial structure 16 are not lines, but rather as a structured pattern.

The structured pattern may be formed, for example, in the form of hatched lines or a chessboard-type pattern with substructures. The size of the substructure of the pattern may be in the region of a few μm or even smaller.

The invention has been described in connection with exposure tools from the company Canon. However, other configurations of the first partial structure and the second partial structure are possible such that exposure tools from other manufacturers can be used.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

We claim:

1. An alignment mark for the coarse alignment and fine alignment of a semiconductor wafer in an exposure tool, comprising:
   a first partial structure for generating a first reflection pattern in the exposure tool for the fine alignment of the semiconductor wafer, the first partial structure comprising a plurality of first structure elements arranged in a plurality of groups, within each group, the first structure elements being arranged relatively parallel and in a manner lying next to one another with a predetermined distance between midpoints, the plurality of groups being arranged symmetrically around the center of an inner region; and
   a second partial structure for generating a second reflection pattern in the exposure tool for the coarse alignment of the semiconductor wafer, the second partial structure comprising a plurality of second structure elements, the second structure elements of the second partial structure being formed in a manner corresponding to a pattern stored in the exposure tool and being arranged in the inner region, wherein the second structure elements of the second partial structure further comprise two lines that intersect each other to form a structure of a cross that has a midpoint lying in the center of the inner region.

2. The alignment mark as claimed in claim 1, wherein the first structure elements of the first partial structure are formed as lines or structured patterns.

3. The alignment mark as claimed in claim 2, wherein the first partial structure comprises four groups, within each group, the first structure elements of the first partial structure being formed in lines, the lines being spaced apart relatively equidistantly, the four groups being arranged relatively mirror-symmetrically around the center of the inner region in the horizontal and vertical direction.

4. The alignment mark as claimed in claim 3, wherein the first partial structure comprises a total of eight lines.

5. The alignment mark as claimed in claim 2, wherein the first partial structure occupies an area having outer sides with a length of approximately 80 μm.

6. The alignment mark as claimed in claim 2, wherein the first partial structure occupies an area having outer sides with a length of approximately 60 μm.

7. A method of making an alignment mark for the coarse alignment and fine alignment of a semiconductor wafer in an exposure tool, the method comprising:
   providing a first partial structure for generating a first reflection pattern in the exposure tool for the fine alignment of the semiconductor wafer, the first partial structure comprising a plurality of first structure elements arranged in a plurality of groups, within each group, the first structure elements being arranged relatively parallel and in a manner lying next to one another with a predetermined distance between midpoints, the plurality of groups being arranged relatively symmetrically around the center of an inner region; and
   providing a second partial structure for generating a second reflection pattern in the exposure tool for the coarse alignment of the semiconductor wafer, the second partial structure comprising a plurality of second structure elements, the second structure elements of the second partial structure being formed in a manner corresponding to a pattern stored in the exposure tool and being arranged in the inner region, wherein the second structure elements of the second partial structure further comprise two lines that intersect each other to form a structure of a cross that has a midpoint lying in the center of the inner region.

8. The method as claimed in claim 7, wherein the first structure elements of the first partial structure are formed as lines or structured patterns.

9. The method as claimed in claim 8, wherein the first partial structure comprises four groups, within each group, the first structure elements of the first partial structure being formed in lines spaced apart relatively equidistantly, the four groups being arranged relatively mirror-symmetrically around the center of the inner region in the horizontal and vertical direction.

10. The method as claimed in claim 9, wherein the first partial structure comprises a total of eight lines.

11. The method as claimed in claim 8, wherein the first partial structure occupies an area having outer sides with a length of approximately 80 μm.

12. The method as claimed in claim 8, wherein the first partial structure occupies an area having outer sides with a length of approximately 60 μm.

* * * * *